United States Patent
Ishibashi et al.

(10) Patent No.: US 7,606,073 B2
(45) Date of Patent: Oct. 20, 2009

(54) NONVOLATILE SEMICONDUCTOR MEMORY WITH DUMMY CELL WHICH IS ABSENCE OF A SOURCE/DRAIN REGION

(75) Inventors: Shigeru Ishibashi, Kawasaki (JP); Mitsuhiro Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 131 days.

(21) Appl. No.: 11/847,498

(22) Filed: Aug. 30, 2007

(65) Prior Publication Data

US 2008/0055978 A1 Mar. 6, 2008

(30) Foreign Application Priority Data

Aug. 31, 2006 (JP) ............... 2006-236854

(51) Int. Cl.
*G11C 16/04* (2006.01)
(52) U.S. Cl. ............... 365/185.17; 365/185.2; 365/185.26
(58) Field of Classification Search ............ 365/185.17, 365/185.2, 185.26, 185.33; 257/315, 316
See application file for complete search history.

(56) References Cited

U.S. PATENT DOCUMENTS

| | | | |
|---|---|---|---|
| 6,853,028 B2 * | 2/2005 | Kim et al. ................... | 257/315 |
| 7,158,419 B2 | 1/2007 | Lee et al. | |
| 7,167,393 B2 * | 1/2007 | Oikawa et al. ........... | 365/185.2 |
| 7,195,967 B2 * | 3/2007 | Sasago et al. ............... | 438/217 |
| 7,333,367 B2 * | 2/2008 | Lee et al. .................. | 365/185.2 |
| 2004/0041202 A1 * | 3/2004 | Kim et al. .................... | 257/316 |
| 2006/0278917 A1 | 12/2006 | Forbes et al. | |

FOREIGN PATENT DOCUMENTS

| | | |
|---|---|---|
| JP | 04-230077 | 8/1992 |
| JP | 2001-167592 | 6/2001 |
| JP | 2003-179169 | 6/2003 |
| JP | 2004-342261 | 12/2004 |
| JP | 2006-005006 | 1/2006 |

OTHER PUBLICATIONS

Japanese Office Action dated Apr. 14, 2009 corresponding to U.S. Appl. No. 11/847,498 filed on Aug. 30, 2007.

* cited by examiner

*Primary Examiner*—Gene N. Auduong
(74) *Attorney, Agent, or Firm*—Turocy & Watson, LLP

(57) ABSTRACT

A nonvolatile semiconductor memory according to the present invention includes a memory cell transistor which is disposed in a first region and which has a gate electrode of a stacked structure, and a dummy cell which is disposed in a second region neighboring the first region and which has a gate electrode having the same structure as that of the gate electrode of the memory cell transistor. The memory cell transistor and dummy cell are connected to the same word line. The memory cell transistor has a diffusion layer serving as the source/drain region thereof, while the dummy cell does not have the diffusion layer serving as the source/drain region thereof.

20 Claims, 12 Drawing Sheets

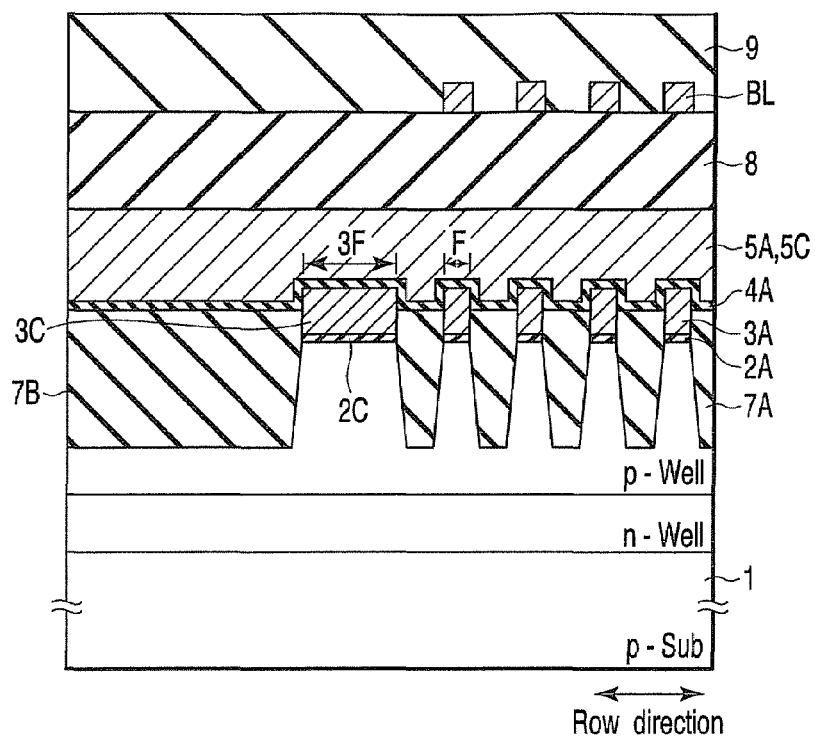
F I G. 19
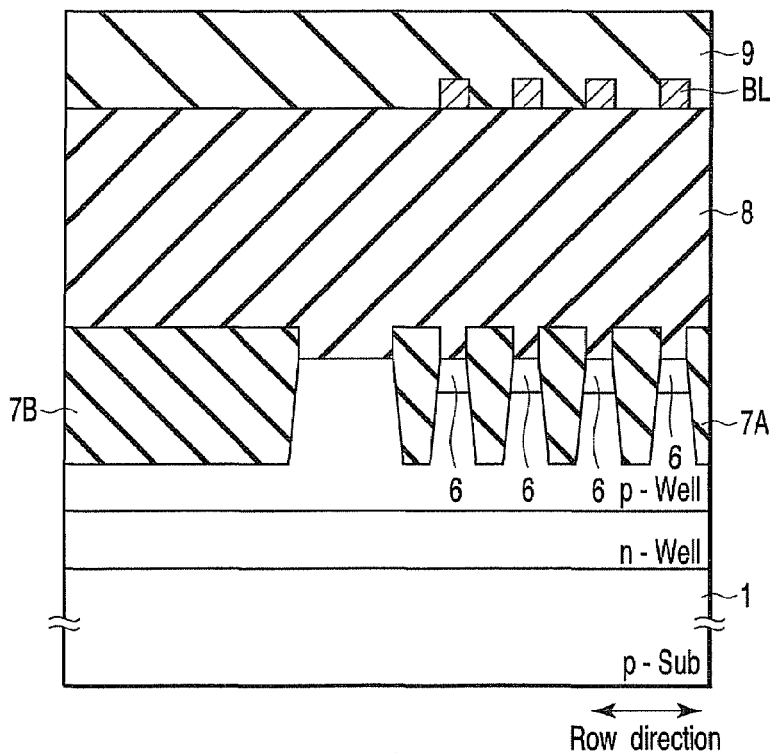
F I G. 20 ated to the active area of a memory cell transistor in terms of the row direction width, design rule of 3F or more is applied to the active area of the region neighboring the memory cell array.
NONVOLATILE SEMICONDUCTOR MEMORY WITH DUMMY CELL WHICH IS ABSENCE OF A SOURCE/DRAIN REGION

CROSS-REFERENCE TO RELATED APPLICATIONS

This application is based upon and claims the benefit of priority from prior Japanese Patent Application No. 2006-236854, filed Aug. 31, 2006, the entire contents of which are incorporated herein by reference.

BACKGROUND OF THE INVENTION

1. Field of the Invention

The present invention relates to a nonvolatile semiconductor memory and, more particularly, to a flash memory.

2. Description of the Related Art

A nonvolatile semiconductor memory, e.g., a NAND-type flash memory is mainly constituted by a memory cell array and a peripheral circuit disposed around the memory cell array.

For example, the gate electrode of a memory cell transistor provided in the memory cell array region is connected to a row decoder circuit through an interconnect line region.

In the boundary between the memory cell array region and interconnect line region, dummy cells that do not function as a memory cell are provided within a region neighboring the terminal end of the memory cell array (refer to e.g., Jpn. Pat. Appln. Publication No. 2004-342261).

If the periodicity of the pattern is distorted in the region neighboring the terminal end of the memory cell array including the dummy cells having the same configuration as that of the memory cell array region, a pattern collapse occurs at process time. In order to prevent the occurrence of the pattern collapse, the region neighboring the terminal end of the memory cell array is designed such that the row direction width thereof becomes larger than that of the memory cell array region. Assuming that design rule F is applied to the active area of a memory cell transistor in terms of the row direction width, design rule of 3F or more is applied to the active area of the region neighboring the memory cell array.

The memory cell transistor provided in the memory cell array region has a three-dimensional floating gate structure in which the upper surface and side surfaces of a floating gate electrode are covered by a control gate electrode through an inter-gate insulating film.

However, as described above, the row direction width of the active area is large in the region neighboring the terminal end of the memory cell array. Therefore, the area in which the control gate electrode covers the side surfaces of the floating gate electrode is smaller than the area in which it covers the upper surface of the floating gate electrode. Accordingly, the area in which the floating gate electrode and control gate electrode are opposed to each other becomes larger than that in the memory cell array region, with the result that the floating gate electrode becomes close to a two-dimensional floating gate structure.

Therefore, two-dimensional effect becomes increased in the gate electrode in the region neighboring the terminal end of the memory cell array, which increases the capacitance between the control gate electrode and floating gate electrode, with the result that the coupling ratio of the dummy cell is decreased. It follows that when a write voltage is applied to a word line which is shared by a memory cell and dummy cell, a voltage applied to an inter-gate insulating film interposed between the control gate electrode and floating gate electrode in the dummy cell becomes higher than that in the memory cell.

When the inter-gate insulating film is broken down by the application of the write voltage, the write voltage is applied only to a tunnel oxide film to thereby cause a short-circuit between the gate electrode and a semiconductor substrate.

To avoid this, a method can be considered where the oxide film formed on the substrate in the region neighboring the terminal end of the memory cell array is thicker than that of in the memory cell array region. In this case, however, an area for forming the thick oxide film is required to increase the size of the memory cell array region to form transition area.

BRIEF SUMMARY OF THE INVENTION

A nonvolatile semiconductor memory of an aspect of the present invention comprises: a memory cell transistor which is disposed in a first region and which has a gate electrode of a stacked structure; and a dummy cell which is disposed in a second region neighboring the first region and which has a gate electrode having the same structure as that of the gate electrode of the memory cell transistor, wherein the memory cell transistor and dummy cell are connected to the same word line, and the memory cell transistor has a diffusion layer serving as the source/drain region thereof, while the dummy cell does not have the diffusion layer serving as the source/drain region thereof.

A nonvolatile semiconductor memory of an aspect of the present invention comprises: a memory cell transistor which is disposed in a first region and which has a gate electrode of a stacked structure; and a dummy cell which is disposed in a second region neighboring the first region and which has a gate electrode having the same structure as that of the gate electrode of the memory cell transistor, wherein the size of the second region in the word line extending direction is larger than the size of the first region in the word line extending direction, and the memory cell transistor has a diffusion layer serving as the source/drain region thereof, while the dummy cell does not have the diffusion layer serving as the source/drain region thereof.

A nonvolatile semiconductor memory of an aspect of the present invention comprises: a plurality of memory cell transistor which is disposed on an active area extending a first direction in a first region and which has a gate electrode of a stacked structure; and a plurality of dummy cell which is disposed on an active area in a second region neighboring the first region and which has a gate electrode having the same structure as that of the gate electrode of the memory cell transistor, wherein a size of the dummy cell in a second direction perpendicular to the first direction is larger than a size of the memory cell transistor in the second direction, and each of the memory cell transistors has a diffusion layer serving as the source/drain region thereof, while each of the dummy cells does not have the diffusion layer serving as the source/drain region thereof.

BRIEF DESCRIPTION OF THE SEVERAL VIEWS OF THE DRAWING

FIG. 19 is a cross-sectional view taken along XIX-XIX line of FIG. 18;

FIG. 20 is a cross-sectional view taken along XX-XX line of FIG. 18;

DETAILED DESCRIPTION OF THE INVENTION

1. Outline

An embodiment of the present invention is featured in that in a region neighboring the terminal end of a memory cell array having the same stacked gate electrode as a memory cell array region, a diffusion layer serving as the source/drain region is not formed. The region neighboring the terminal end of the memory cell array is positioned at the boundary between the memory cell array region and an interconnect line region. Hereinafter, this region is referred to as "memory cell array neighboring region".

When a write pulse voltage having a pulse width of about 100 μsec is applied to a word line (control gate electrode) extending in the row direction in the above configuration, an inversion layer is not formed on a semiconductor substrate in the memory cell array neighboring region due to absence of the source/drain region and shorter write pulse than the recombination lifetime of minority carriers.

Instead, the semiconductor substrate region immediately under the gate electrode of dummy cells goes into a Deep Depletion state to form a depletion layer, with the result that, in the memory cell array neighboring region, the major part of the write voltage is applied to the depletion layer formed in the semiconductor substrate.

Thus, it is possible to reduce a voltage and a write stress applied to the inter-gate insulating film and tunnel oxide film in the memory cell array neighboring region and, thereby, to reduce dielectric breakdown of the inter-gate insulating film and tunnel oxide film.

2. Embodiment

A concrete embodiment of the present invention will next be described with reference to the accompanying drawings.

(1) Structure

With reference to FIGS. 1 to 6, a structure of a nonvolatile semiconductor memory according to the embodiment of the present invention will be described.

Figure 1:
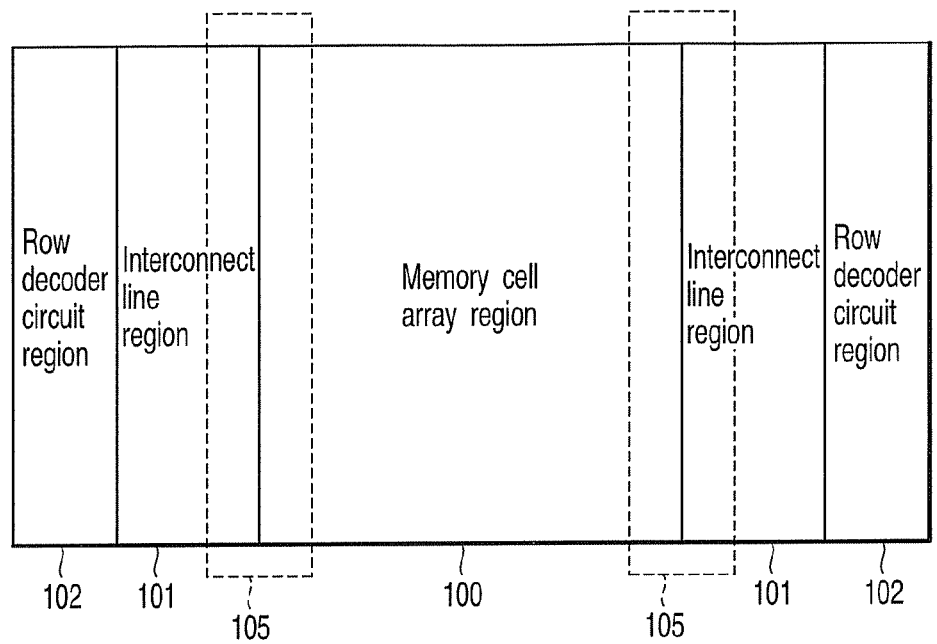
FIG. 1 is a view showing an outline of the layout of a flash memory.

FIG. 1 shows the layout of a nonvolatile semiconductor memory, e.g., a flash memory according to the present embodiment. Hereinafter, a structure of a NAND-type flash memory will be described as an example.

As shown in FIG. 1, an interconnect line region 101 is disposed between a memory cell array region (first region) 100 and a row decoder circuit region 102. In the present embodiment, a region 105 disposed at the boundary between the memory cell array region 100 and interconnect line region 101 is defined as a memory cell array neighboring region (second region) 105.

Figure 2:
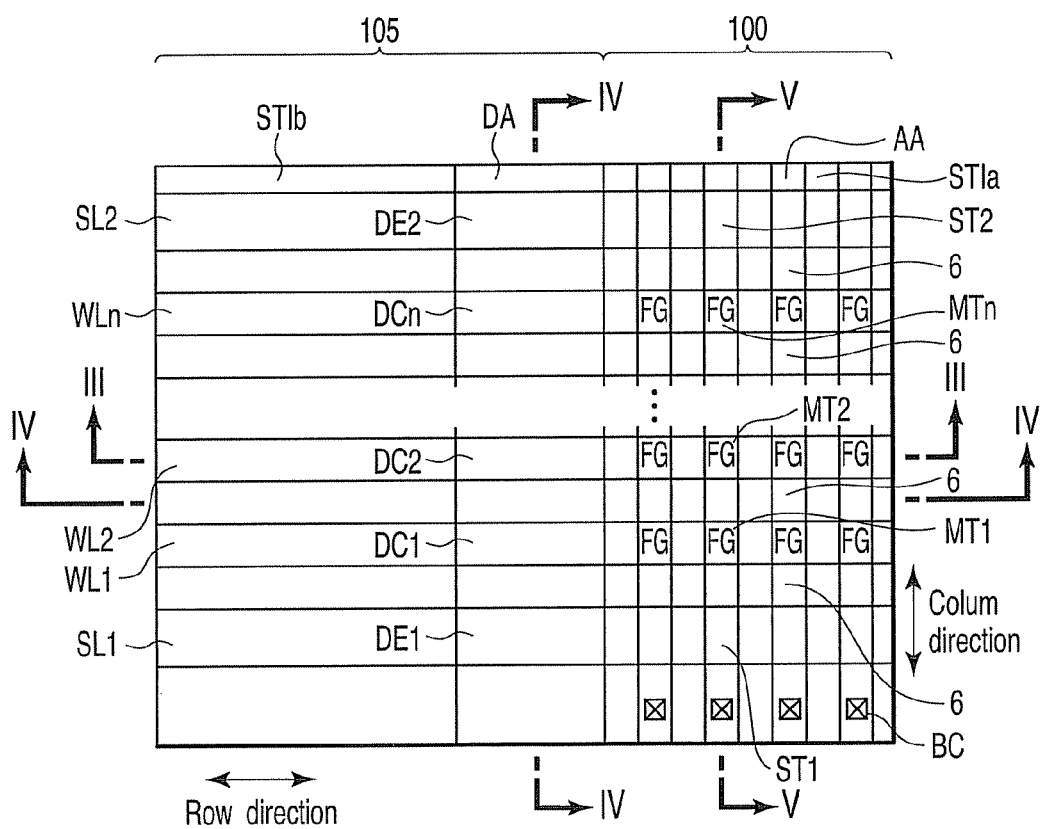
FIG. 2 is a plan view showing a part of a memory cell array neighboring region and a memory cell array region.
Figure 3:
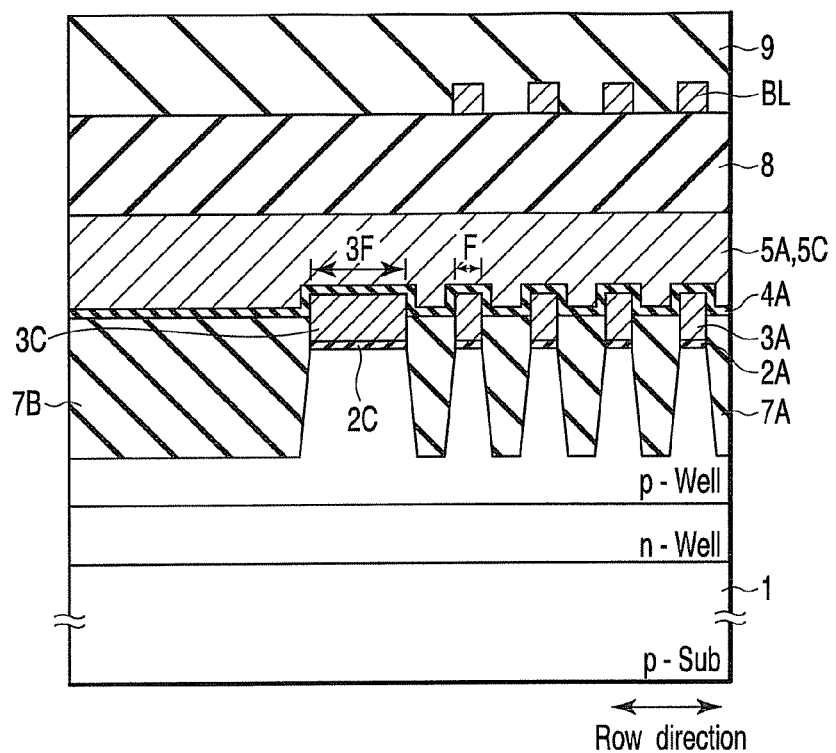
FIG. 3 is a cross-sectional view taken along III-III line of FIG. 2.
Figure 4:
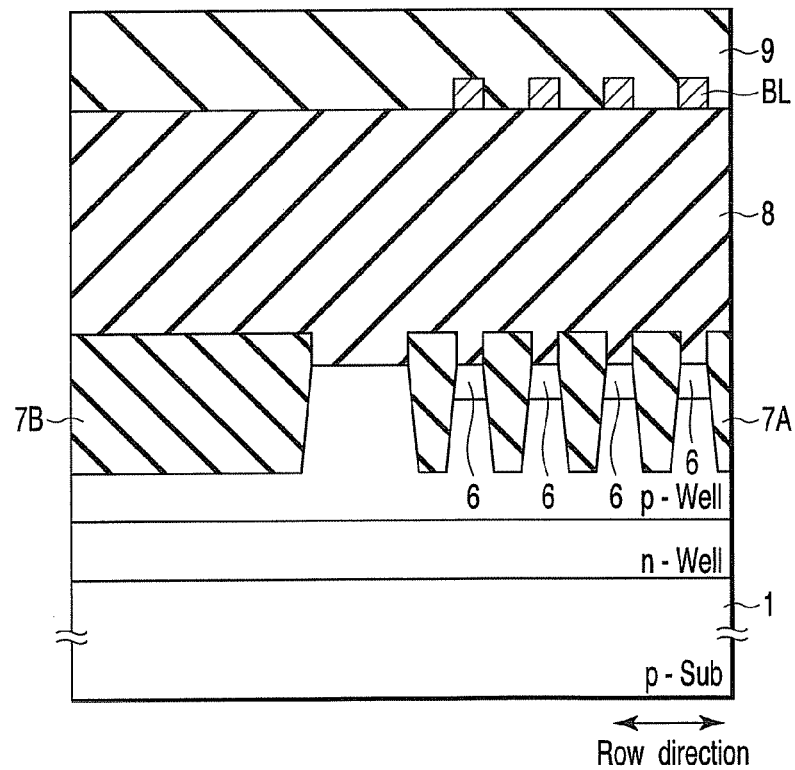
FIG. 4 is a cross-sectional view taken along IV-IV line of FIG. 2.
Figure 5:
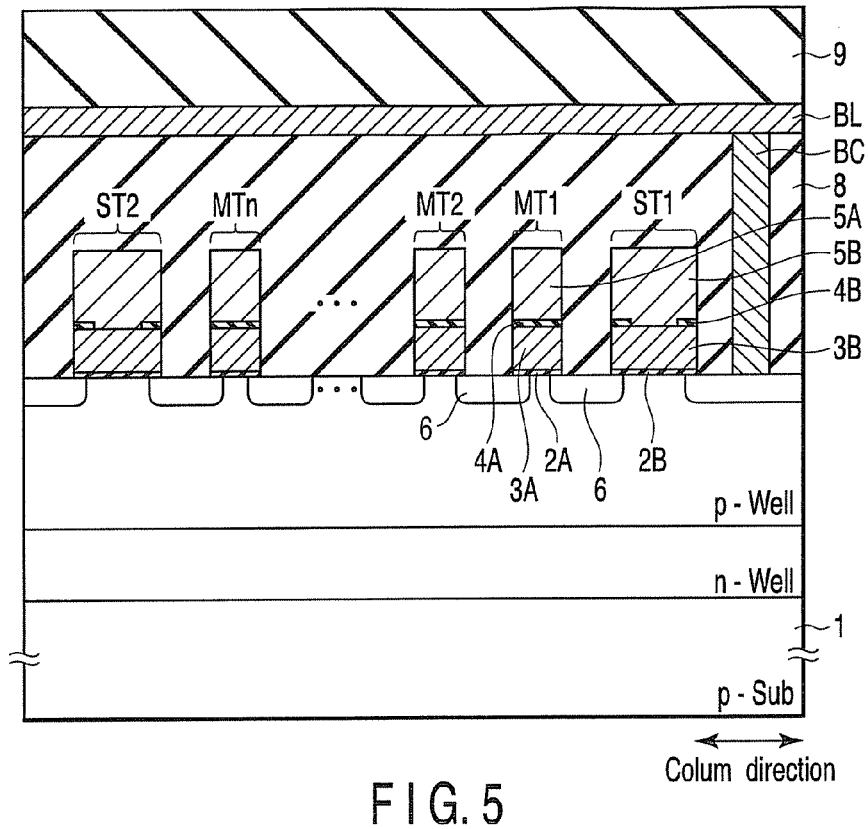
FIG. 5 is a cross-sectional view taken along V-V line of FIG. 2.
Figure 6:
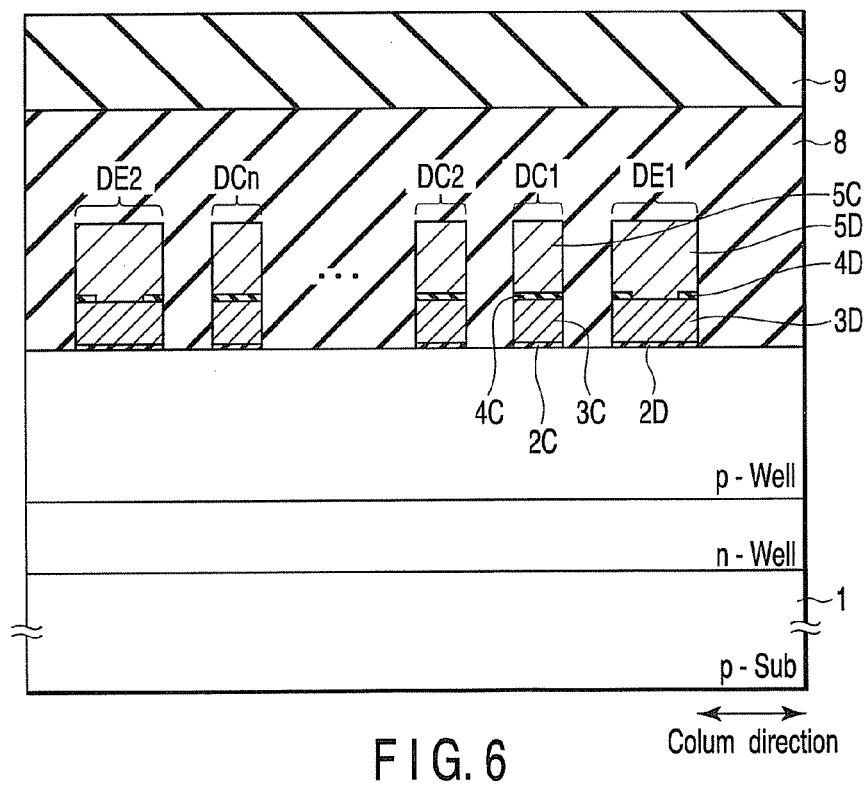
FIG. 6 is a cross-sectional view taken along VI-VI line of FIG. 2.

FIG. 2 shows a plan view of the memory cell array region 100 and memory cell array neighboring region 106. FIG. 3 is a cross-sectional view taken along III-III line of FIG. 2. FIG. 4 is a cross-sectional view taken along IV-IV line of FIG. 2. FIG. 5 is a cross-sectional view taken along V-V line of FIG. 2. FIG. 6 is a cross-sectional view taken along VI-VI line of FIG. 2.

The memory cell array region 100 includes a plurality of sets of an active area (element area) AA in which an element is formed and an element isolation area STIa for isolating elements which has, e.g., an STI (Shallow Trench Isolation) structure. The active area AA extends in the vertical direction as viewed in FIG. 3, and is divided in the horizontal direction as viewed in FIG. 3 by element isolation area STIa.

In the active area AA, memory cell transistors MT1 to MTn connected in series and select transistors ST1 and ST2 disposed on both sides of the memory cell transistors MT1 to MTn are formed as one NAND cell unit. A plurality of NAND cell units are formed A floating gate electrode 3A of each of the memory cell transistors MT1 to MTn is formed on a gate insulating film (tunnel oxide film) 2A formed on the surface of a semiconductor substrate 1. A plurality of NAND cell units, each having this structure, are formed in an array that is perpendicular to the extending direction of the active area AA, with element isolation area STIa interposed between the adjacent NAND cell units. As a result, the memory cell transistors are arranged in a matrix pattern in the memory cell array region 100.

A control gate electrode 5A is so formed as to cover the upper surface and side surfaces in the channel width direction of the floating gate electrode 3A through an inter-gate insulating film 4A. The respective control gate electrodes 5A extend in the row direction that is perpendicular to the extending direction of the active area as word lines WL1 to WLn and are connected to a row decoder circuit provided in a row decoder circuit region 102 through interconnect lines provided in the interconnect line region 101.

The inter-gate insulating film 4A is formed to have a thickness of, e.g., 5 nm to 30 nm. The inter-gate insulating film 4A may be a silicon oxide film, silicon oxynitride film, or silicon oxide film/silicon nitride film/silicone oxide film (ONO film). Further, the inter-gate insulating film 4A may be a single layer or stacked film of a high dielectric material such as HfAlO, AlO, HfSiO, ZrSiO.

In the case where a material other than a silicon oxide film, such as a material having a stacked structure such as the ONO film or high dielectric material is used as the inter-gate insulating film, it is preferable that the thickness of the material be 13 nm or less in terms of silicon oxide film equivalent thickness.

The select transistors ST1 and ST2 are formed together with the memory cell transistors MT1 to MTn and have the same gate structure as the stacked gate structure of the memory cell transistors MT1 to MTn.

Therefore, each of the select transistors ST1 and ST2 has the gate structure in which a gate electrode 3B formed on a gate insulating film 2B and a gate electrode 5B are connected to each other through an opening portion formed in an inter-gate insulating film 4B.

A diffusion layer 6, which serves as the source/drain region of the memory cell transistors MT1 to MTn and select transistors ST1 and ST2, is shared between adjacent two memory cell transistors or between the memory cell transistor and select transistor which are adjacently disposed.

The memory cell transistors MT1 to MTn and select transistors ST1, ST2 are formed on a p-type silicon region p-Well surrounded by a n-type silicon region n-Well in the p-type semiconductor 1. This configuration allows a voltage to be applied independently to the p-type silicon region p-Well and p-type semiconductor substrate 1, thereby reducing power consumption at the time of erase operation.

The memory cell array neighboring region 105 has a dummy active area DA in which dummy cells are formed and a memory cell array peripheral element isolation area STIb having, e.g., an STI structure. Although only one dummy active area DA is shown in the present embodiment for the shake of simplification, the memory cell array neighboring region 105 may include a plurality of dummy active areas DA.

Dummy cells DC1 to DCn and dummy electrode (dummy cell) DE1 and DE2 formed in the dummy active area DA have the same configurations as those of the memory cell transistors MT1 to MTn and select transistors ST1 and ST2, respectively.

That is, a dummy floating gate electrode 3C is formed on a gate insulating film (tunnel oxide film) 2C formed on the surface of the semiconductor substrate 1. Further, a control gate electrode 5C is so formed as to cover the upper surface and side surfaces of the dummy floating gate electrode 3C through an inter-gate insulating film 4C. The respective control gate electrodes 5C extends in the row direction as the word lines WL1 to WLn which is shared with the control gate electrodes 5A of the memory cell transistors MT1 to MTn in linearly arranged in the row direction. Therefore, the word lines WL1 to WLn cross the memory cell array neighboring region 105 to form transition area. Since the memory cell transistors are arranged in a matrix pattern in the memory cell array region 100, the memory cell transistors linearly arranged in the row direction are shared by the control gate electrode 5A corresponding to the word lines WL1 to WLn. And also, the respective select gate electrodes 5B, 3B extends in the row direction as the select gate lines SL1 and SL2 which is shared with the dummy electrodes 5D, 3D formed in the memory cell array neighboring region 105 in linearly arranged in the row direction. Therefore, the select gate lines SL1, SL2 cross the memory cell array neighboring region 105.

Here, assuming that the size of each of the memory cell transistors MT1 to MTn formed in the memory cell array region 100 in the row direction is F, the size of the memory cell array neighboring region 105 in the row direction is set to, e.g., 3F to 20F. Needless to say, the size as measured in the row direction may be an arbitrary value in the range of F to 3F. Alternatively, the size as measured in the row direction may be an arbitrary value greater than 20F.

As described above, the row direction size of the dummy active area formed in the memory cell array neighboring region 105 is large. Accordingly, the ratio of the area in which the control gate electrode 5C covers the upper surface of the dummy floating gate electrode 3C through the inter-gate insulating film 4C becomes larger than the ratio of the area in which the control gate electrode 5C covers the side surfaces of the dummy floating gate electrode 3C.

Thus, the area in which the floating gate electrode and control gate electrode are opposed to each other becomes larger as compared in a three-dimensional floating gate electrode structure like the memory cell transistor in the memory cell array region 100, with the result that the dummy floating gate electrode 3C of the dummy cell DC becomes close to a two-dimensional floating gate electrode structure.

Therefore, the capacitance between the control gate electrode 5C and dummy floating gate electrode 3C is increased, with the result that the coupling ratio of each of the dummy cells DC1 to DCn is decreased. The coupling ratio corresponds to the ratio of the voltage change amount of the dummy floating gate electrode 3C relative to the voltage change amount of the control gate electrode 5C, so that a voltage applied to the inter-gate insulating film 4C between the control gate electrode 5C of the dummy cell and dummy floating gate electrode 3C becomes higher than that applied to the inter-gate insulating film 4A in the memory transistor.

The dummy electrodes DE1 and DE2 each have the same structure as that of the select transistors ST1 and ST2.

As described above, a stacked gate electrode is formed in the memory cell array neighboring region 105. However, in the memory cell array neighboring region 105, a diffusion layer serving as the source/drain region of the stacked gate electrode is not formed in the semiconductor substrate 1. Therefore, the dummy cells DC1 to DCn and dummy gate electrodes DE1 and DE2 do not function as MOS transistors but as MOS capacitors.

The dummy active area DA in the memory cell array neighboring region 105 may be designed in a size corresponding to the size of each of the memory cell transistors MT1 to MTn.

(2) Effect

Next, effects obtained in the case where a write pulse voltage is applied to the word line of the NAND-type flash memory having the above structure will be described with reference to FIGS. 7 and 8.

Figure 7:
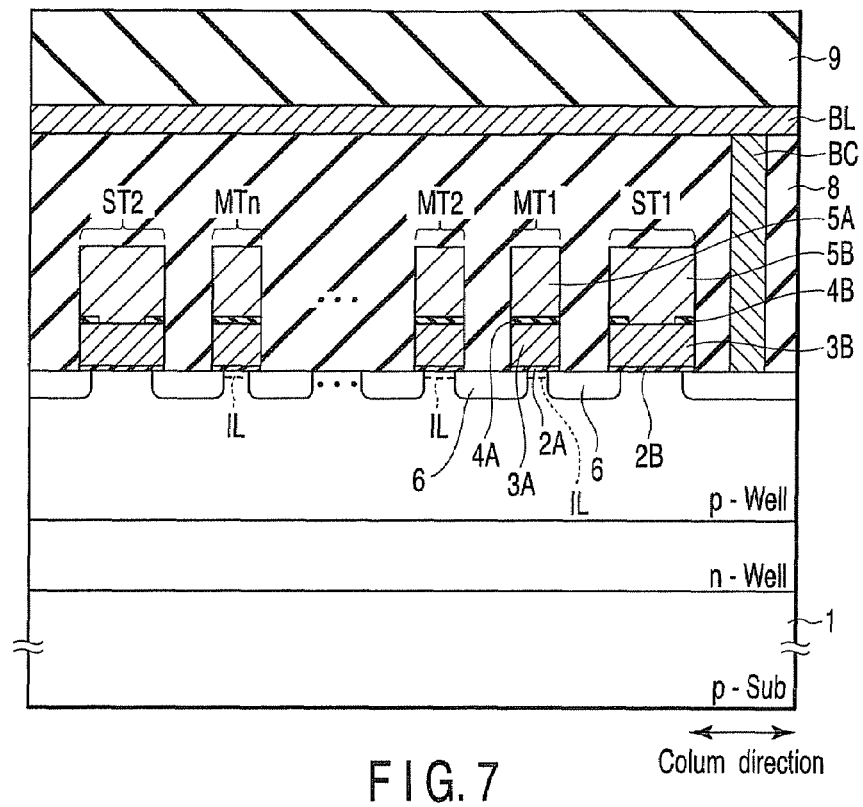
FIG. 7 is a cross-sectional view of the memory cell array region at the voltage application time.
Figure 8:
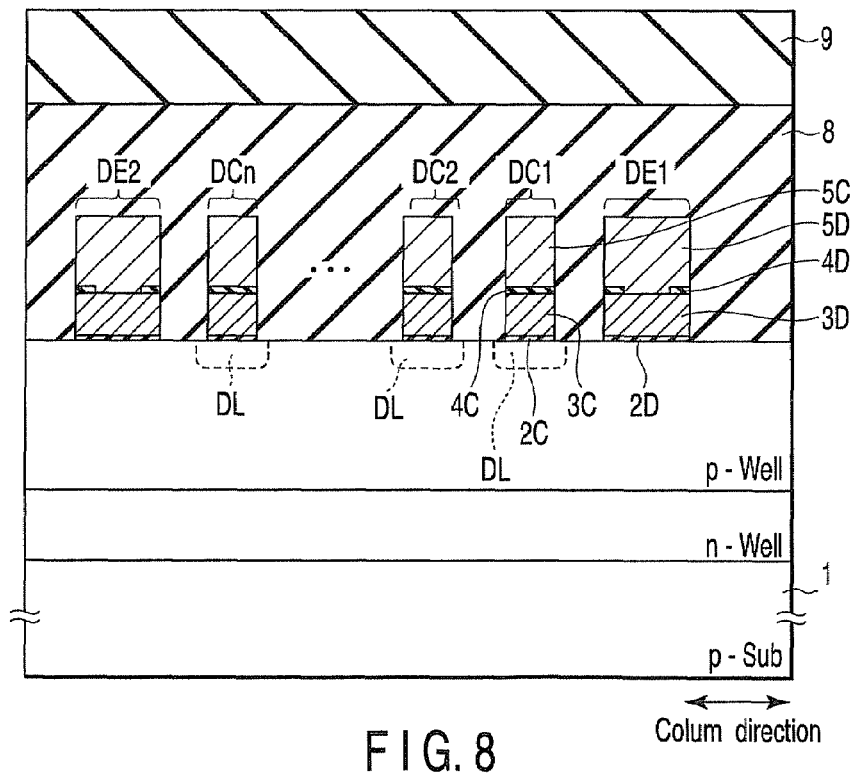
FIG. 8 is a cross-sectional view of the memory cell array neighboring region at the voltage application time.

FIG. 7 is a view schematically showing the column direction cross-section of the memory cell array region 100 at the time of application of a write pulse voltage, and FIG. 8 is a view schematically showing the column direction cross-section of the memory cell array neighboring region 105 at the time of application of a write pulse voltage.

The write pulse voltage to be applied is a voltage of 10 V to 30 V with a pulse width of 100 μsec or less.

As shown in FIG. 7, when the write pulse voltage is applied to the memory cell transistors MT1 to MTn in the memory cell array region 100, inversion layers IL are formed in regions immediately under the gate electrodes of the memory cell transistors MT1 to MTn, i.e., in the channel regions between adjacent two diffusion layers 6.

On the other hand, as shown in FIG. 8, the dummy cells DC1 to DCn in the memory cell array neighboring region 105 have the same stacked gate electrodes as those of the memory cell transistors MT1 to MTn in the memory cell array region 100, and the control gate electrodes 5C constituting the stacked gate electrodes cross the memory cell array neighboring region 105 as the word lines WL1 to WLn extending from the memory cell array region 100. Accordingly, the write pulse voltage is applied to the memory cell array neighboring region 105.

Since the diffusion layer serving as the source/drain region is not formed in the memory cell array neighboring region 105, the memory cell array neighboring region 105 does not assume a MOS transistor structure.

Thus, in the case where the write pulse voltage is applied to the dummy cells DC1 to DCn in the memory cell array neighboring region 105, minority carriers are not generated in the semiconductor substrate 1 in the region immediately under the gate electrodes. This is because that the recombination lifetime of minority carriers in a silicon in which a transition metal is not intentionally doped is 1 to 100 msec, so that response of the majority carriers dominates in the semiconductor substrate 1 in the case of the write pulse voltage having a pulse width less than 1 to 100 msec, e.g., 100 μsec or less.

Therefore, the inversion layer is not formed in the semiconductor substrate 1 within the memory cell array neighboring region 105, causing this semiconductor substrate region to go into a Deep Depletion state to form depletion layers DL at the portions immediately under the gate electrodes, with the result that, the major part of the write voltage is applied to the depletion layers DL.

Thus, in the memory cell array neighboring region 105, it is possible to reduce a write voltage applied to each gate insulating film 2C and each inter-gate insulating film 4C and a write stress applied to each of the inter-gate insulating films 4C of the dummy cells DC1 to DCn.

In general, when the writing operation is performed for the memory cell transistors MT1 to MTn, electrons in the semiconductor substrate 1 are injected into the dummy floating gate electrodes 3C of the dummy cells DC1 to DCn with which the word lines are shared through the gate insulating films (tunnel oxide films) 2C. Further, at the erase operation time, electrons in the dummy floating gate electrodes 3C are discharged to the semiconductor substrate 1 through the gate insulating films (tunnel oxide films) 2C.

On the other hand, when the above structure according to the present embodiment is employed, the depletion layers DL are formed at the write operation time or erase operation time in the semiconductor substrate 1 in the region immediately under the gate electrodes of the dummy cells DC1 to DCn, so that the number of electrons to be passed through the gate insulating films (tunnel oxide films) 2C and injected into the dummy floating gate 3C is decreased. Therefore, when write operation or erase operation is performed for the memory cell transistors MT1 to MTn, the amount of the current (number of electrons) to be passed through the gate insulating films (tunnel oxide films) of the dummy cells DC1 to DCn can be reduced.

As a result, the damage of the gate insulating films (tunnel oxide films) 2C of the dummy cells caused by the passing current can be reduced.

It follows that it is possible to reduce a leak current flowing between the dummy floating gate electrodes 3C and semiconductor substrate 1 due to deterioration of the gate insulating films (tunnel oxide films) 2C.

Further, in this structure, even if a leak current flows between the dummy floating gate electrodes 3C and semiconductor substrate 1 in the memory cell array neighboring region 105, it is possible to reduce a possibility of occurrence of dielectric breakdown of the inter-gate insulating films 4C due to application of a write current to thereby prevent a short-circuit from occurring between the control gate electrodes 5C and semiconductor substrate 1.

The present embodiment is particularly effective in the case where the dielectric strength voltage of the inter-gate insulating film cannot be ensured sufficiently, that is, in the case where an inter-gate insulating film having a silicon oxide film equivalent film thickness of 13 nm or less or an inter-gate insulating film susceptible to a high electric field, such as HfAlO, AlO, HfSiO, or ZrSiO is used as the inter-gate insulating film.

The abovementioned effects can be obtained even in the case where the structure and feature of the present embodiment is applied to a nonvolatile memory having a memory cell transistor whose gate electrode has a MONOS structure.

(3) Manufacturing Method

A manufacturing method of the flash memory according to the present embodiment will be described with reference to FIGS. 9 to 22.

Figure 9:
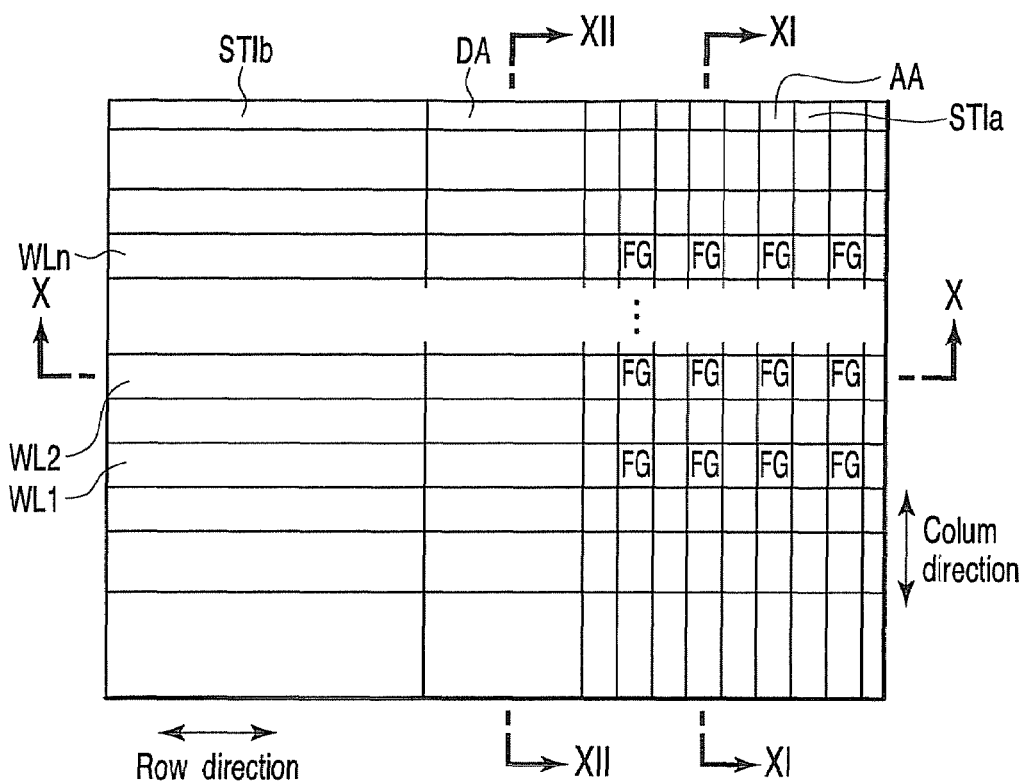
FIG. 9 is a plan view showing a step of a manufacturing process of the flash memory according to the embodiment of the present invention.
Figure 10:
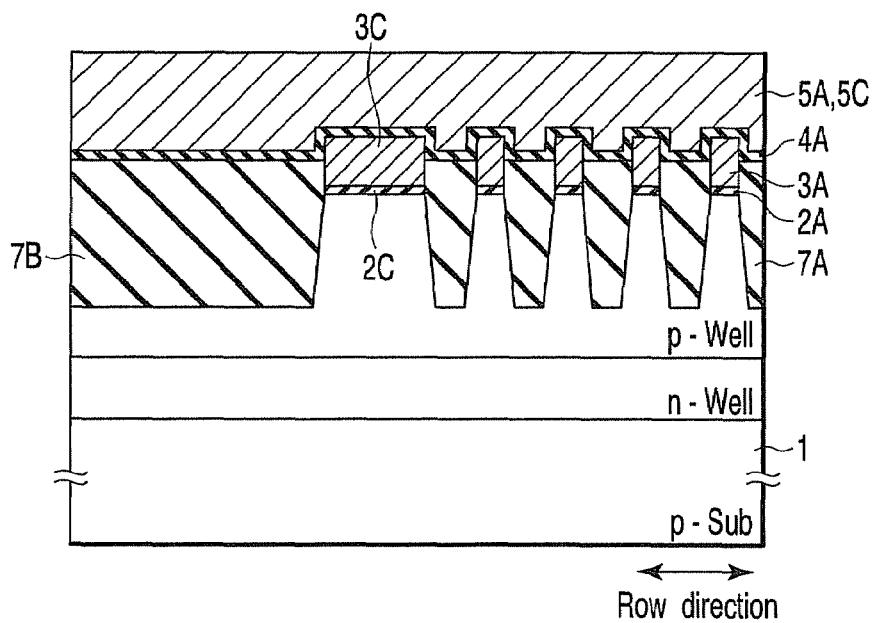
FIG. 10 is a cross-sectional view taken along X-X line of FIG. 9.
Figure 11:
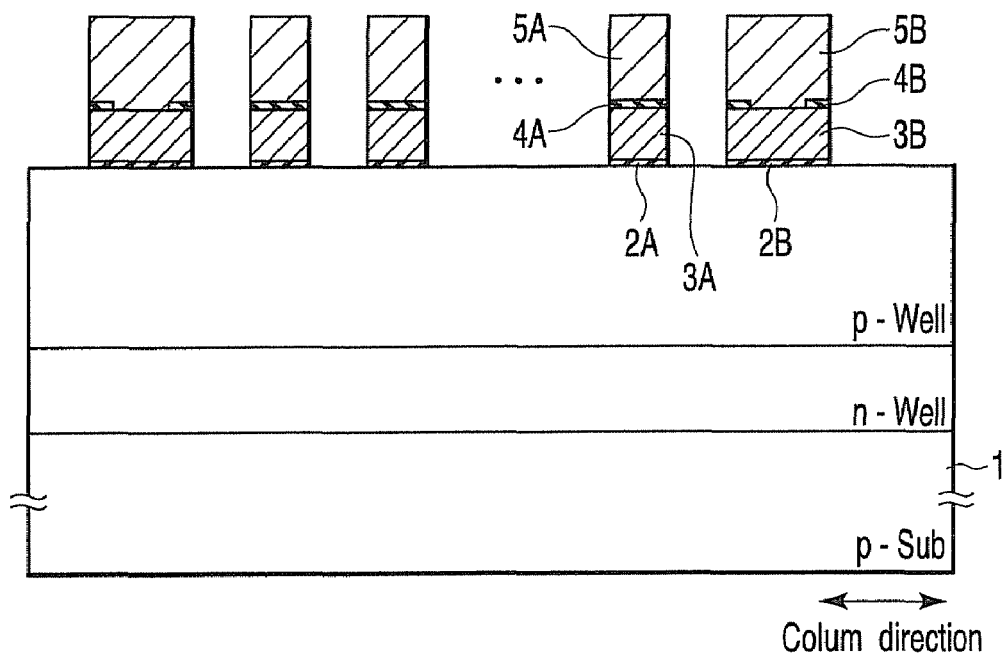
FIG. 11 is a cross-sectional view taken along XI-XI line of FIG. 9.
Figure 12:
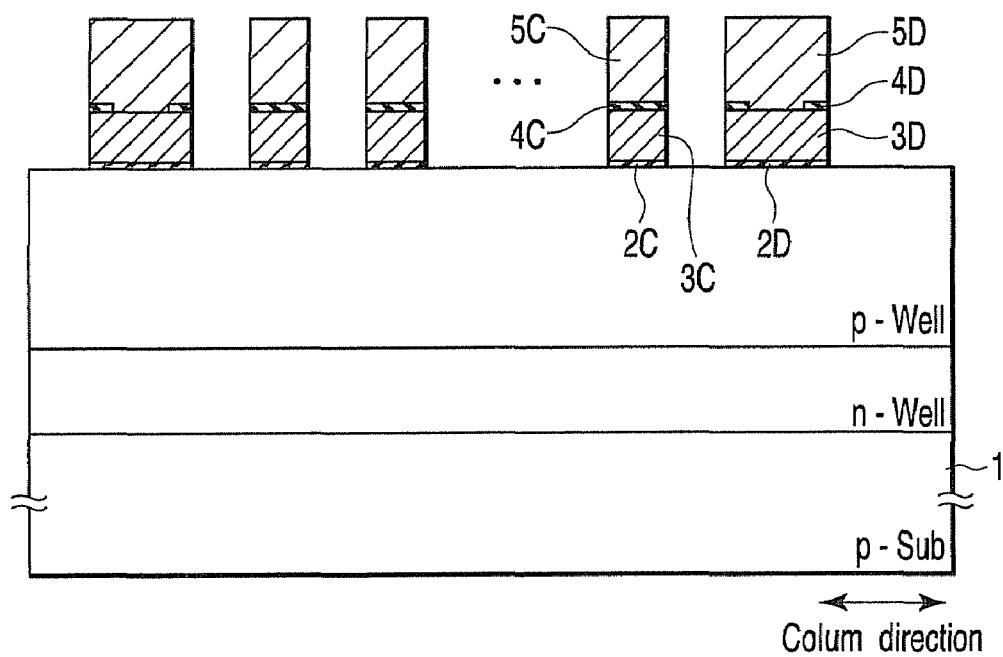
FIG. 12 is a cross-sectional view taken along XII-XII line of FIG. 9.

First, with reference to FIGS. 9 to 12, a first part of a manufacturing process of the flash memory will be described. FIG. 9 is a plan view showing a first part of the manufacturing process of the flash memory according to the embodiment of the present invention. FIG. 10 is a cross-sectional view taken along X-X line of FIG. 9. FIG. 11 is a cross-sectional view taken along XI-XI line of FIG. 9. FIG. 12 is a cross-sectional view taken along XII-XII line of FIG. 9.

As shown in FIGS. 9 to 12, gate insulating films (tunnel oxide film) 2A, 2B, 2C, and 2D are formed on the surface of the p-type silicon region p-Well formed in the semiconductor substrate 1 by, e.g., a thermal oxidation method. Each of the gate oxide films (tunnel oxide film) 2A, 2B, 2C, and 2D is made of a silicon oxide film or silicon oxynitride film having a film thickness of 3 nm to 15 nm.

Subsequently, a polysilicon film serving as the floating gate electrodes 3A, dummy floating gate electrodes 3C, gate electrodes 3B and gate electrodes 3D is formed to have a film thickness of 10 nm to 500 nm on the gate insulating films 2A, 2B, 2C, and 2D by a Chemical Vapor Deposition (CVD) method. Phosphorus or arsenic is doped as an impurity for obtaining conductivity in the polysilicon film at a concentration of about $10^{18}$ to $10^{21}$ cm$^{-3}$.

Subsequently, after a resist (not shown) is applied to the entire surface of the polysilicon film, element isolation trenches each having, e.g., an STI structure are formed to each have a depth of 0.05 to 0.5 μm in the semiconductor substrate 1 by, e.g., a photolithography technique. After that, isolation insulating films 7A and 7B are buried in the isolation trenches.

As a result, in the memory cell array region 100, the active areas AA and element isolation areas STIa are formed; on the other hand, in the memory cell array neighboring region 105, the dummy cell area DA and memory cell peripheral element isolation area STIb are formed.

Assuming that the design rule applied to the active areas AA of the memory cell array region is F, the design rule of F is applied to the element isolation area STIa, and the design rule of not less than 3F to not more than 20F is applied to the dummy cell area DA of the memory cell array neighboring region.

The design rule applied to the dummy cell area DA can be determined as (2n+1)F (n: a natural number), such as 3F or 5F.

In this case, the sum of active areas AA and element isolation areas STIa in the memory cell array region is 2F and therefore has regularity. This regularity can be understood by replacing the dummy cell area DA with a repetitive arrangement of active area AA and element isolation area STIa to which a design rule of F is applied, and by confirming that active area AA and element isolation area STIa align. With this structure, the working margin of the element isolation trench can be improved.

Both the design rule applied to the dummy cell area DA and the design rule applied to the memory cell peripheral element isolation area STIb can be set at 3F. This improves the working margin of the element isolation trench. In addition, the capacitance of the MOS capacitor can be increased, and the write stress applied to the inter-gate insulating film of the dummy cells DC1-DCn can be reduced.

As a result of the above process, the floating gate electrodes 3A are formed on the gate insulating films (tunnel oxide films) 2A in a self-aligned manner with respect to the p-type silicon region p-Well. Therefore, it is possible to form the gate insulating films 2A and floating gate electrodes 3A on the entire smooth surface of the semiconductor substrate 1, thereby obtaining uniform gate insulating films (tunnel oxide films) 2A and floating gate electrodes 3A.

Further, as a result of the above process, it is possible to prevent the end portions of the floating gate electrodes 3A from being dropped into the side surfaces of the gate insulating films (tunnel oxide film) 2A and semiconductor substrate 1. Thus, electric field concentration or parasitic transistor in the end portions of the floating gate electrodes 3A rarely occurs, thereby preventing a decrease in a write threshold voltage, so-called a sidewalk phenomenon caused due to the electric field concentration in the end portions of the floating gate electrodes 3A. Therefore, a high reliable memory transistor can be formed.

Subsequently, after the resist is removed, the inter-gate insulating films 4A, 4B, 4C, and 4D are formed on the entire surfaces of the memory cell array region and memory cell array neighboring region by, e.g., a CVD method. As the inter-gate insulating films 4A, 4B, 4C, and 4D, a silicon oxide film, silicon oxynitride film, or a block insulating film composed of silicon oxide film/silicon nitride film/silicone oxide film (ONO film) or a stacked film including HfAlO, AlO, HfSiO, ZrSiO. The film thickness of the inter-gate insulating film is set to 5 nm to 30 nm.

Subsequently, opening portions reaching the polysilicon film are formed by, e.g., a photolithography technique and a reactive ion etching (RIE) in the inter-gate insulating films in the region in which select transistors are formed.

Thereafter, a polysilicon film serving as the control gate electrodes 5A and control gate electrodes 5C, gate electrodes 5B, and gate electrodes 5D is formed to have a film thickness of 10 nm to 500 nm on the inter-gate insulating films 4A, 4B, 4C, and 4D by a CVD method. Phosphorus, arsenic, or boron is doped as an impurity for obtaining conductivity in the polysilicon film at a concentration of about $10^{18}$ to $10^{21}$ cm$^{-3}$. Alternatively, heat treatment may be applied to the polysilicon film after a metal film made of W, Ni, Mo, Ti, or Co has been deposited thereon to form control gate electrodes each having a stacked structure including a silicide film and polysilicon film.

Thereafter, a resist (not shown) is applied to the polysilicon film, and a resist pattern is formed by, e.g., a photolithography technique, such that the gate length of each memory cell transistor provided in the memory cell region is 10 nm to 500 nm. Then, using this resist pattern as a mask, etching is performed by RIE or the like until the surface of the semiconductor substrate 1 is exposed and, followed by removal of the resist pattern.

Figure 13:
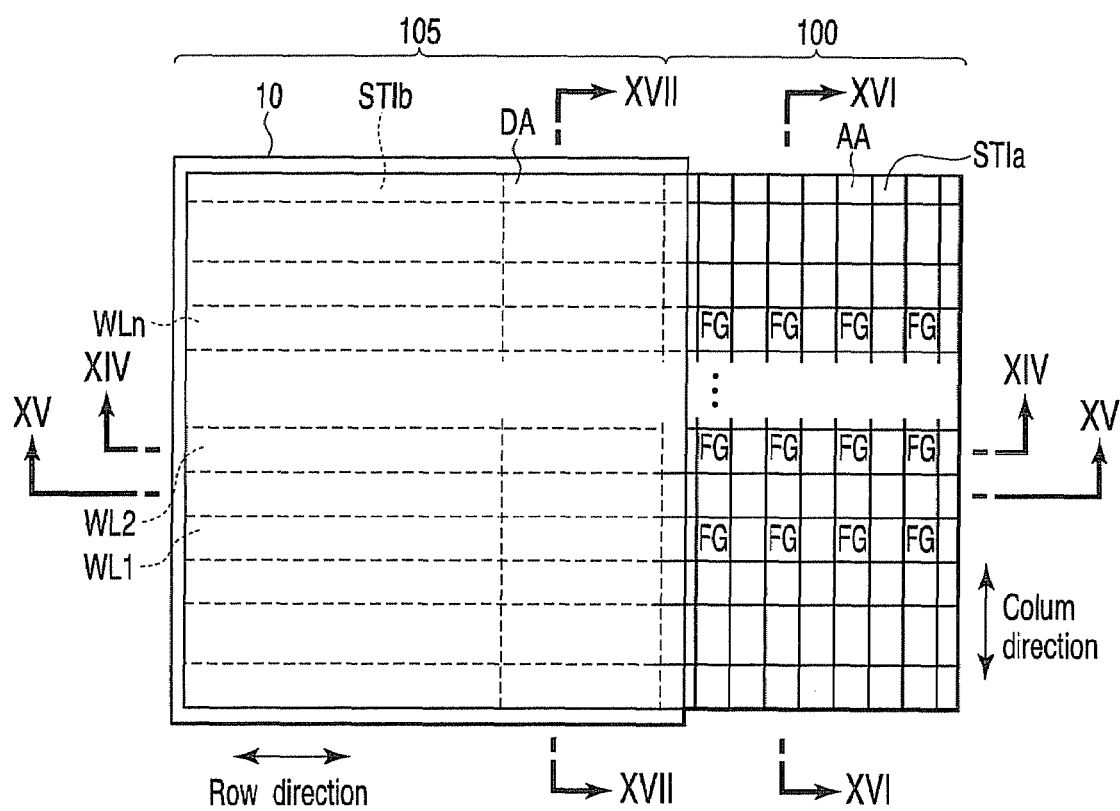
FIG. 13 is a plan view showing a step of the manufacturing process of the flash memory according to the embodiment of the present invention.
Figure 14:
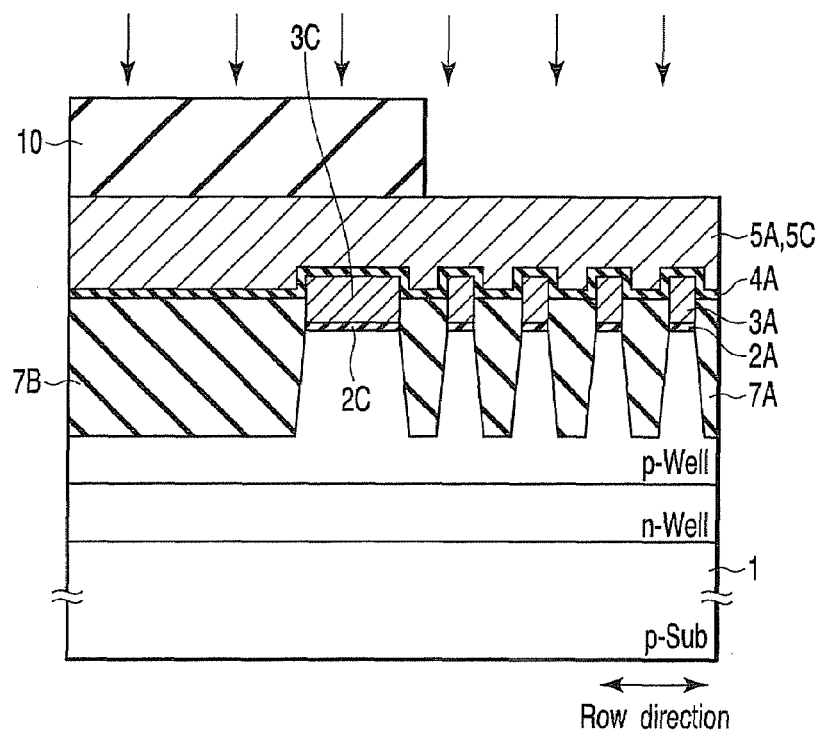
FIG. 14 is a cross-sectional view taken along XIV-XIV line of FIG. 13.
Figure 15:
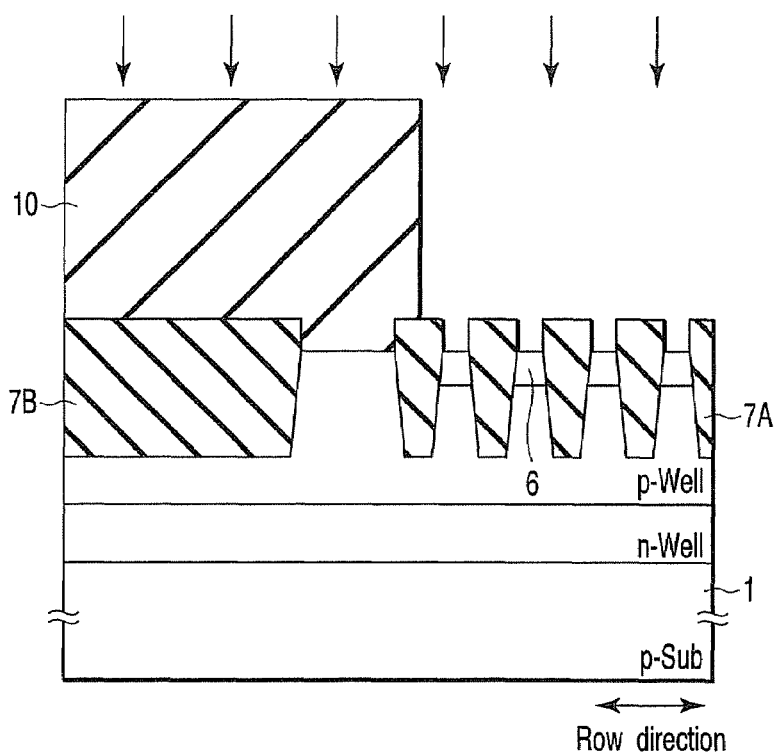
FIG. 15 is a cross-sectional view taken along XV-XV line of FIG. 13.
Figure 16:
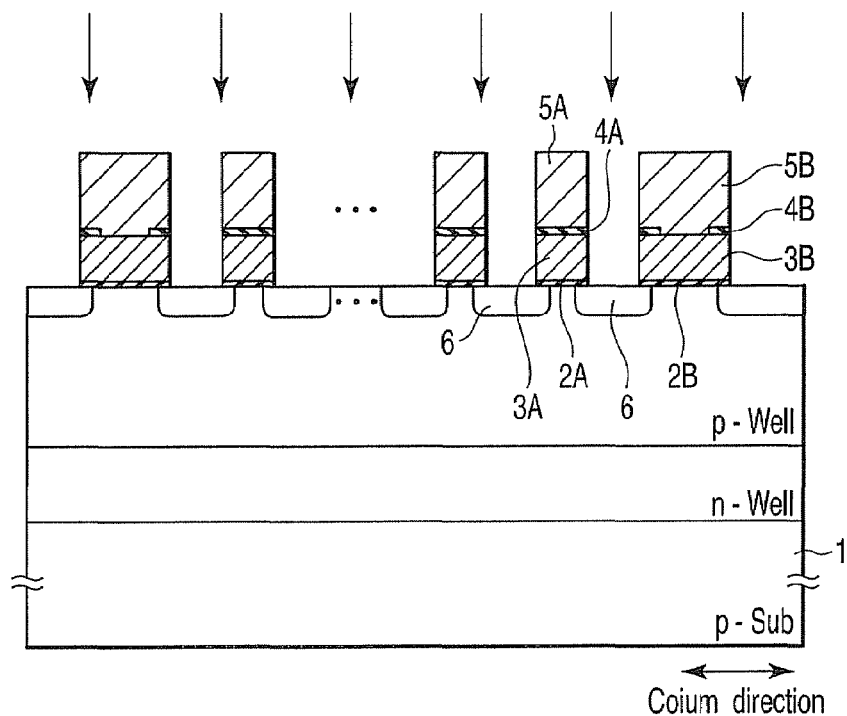
FIG. 16 is a cross-sectional view taken along XVI-XVI line of FIG. 13.
Figure 17:
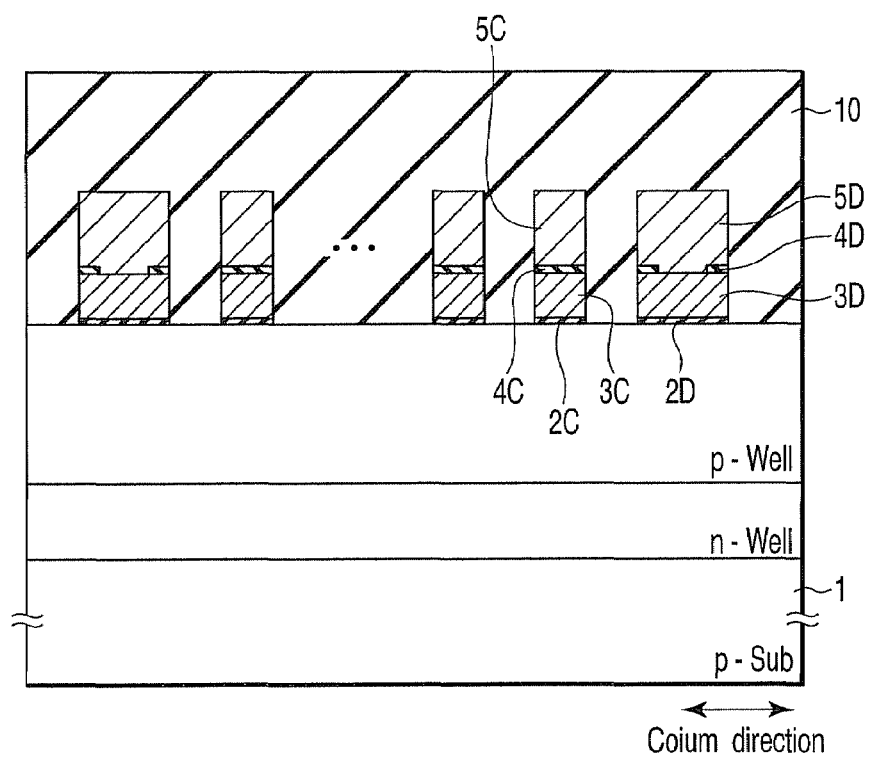
FIG. 17 is a cross-sectional view taken along XVII-XVII line of FIG. 13.

A step of the manufacturing process continued from FIGS. 9 to 12 will next be described with reference to FIGS. 13 to 17. FIG. 13 is a plan view showing a step of the manufacturing process of the flash memory according to the embodiment of the present invention. FIG. 14 is a cross-sectional view taken along XIV-XIV line of FIG. 13. FIG. 15 is a cross-sectional view taken along XV-XV line of FIG. 13. FIG. 16 is a cross-sectional view taken along XVI-XVI line of FIG. 13. FIG. 17 is a cross-sectional view taken along XVII-XVII line of FIG. 13.

After a resist is applied to the upper surfaces of the memory cell array region 100 and memory cell array neighboring region 105, a resist pattern 10 covering only the memory cell array neighboring region 105 is formed on the entire surface of the semiconductor substrate 1 by, e.g., a photolithography technique, as shown in FIGS. 13 to 17.

Subsequently, an impurity is diffused on the entire surface of the semiconductor substrate 1 by an ion injection method using the resist pattern 10 as a mask.

Since, at this time, the memory cell array region 100 is not covered by the resist pattern 10, the diffusion layers 6 serving as the source/drain regions are formed in a self-aligned manner using the stacked gate electrodes of the memory cell transistors MT1 to MTn and select gate transistors ST1 and ST2 as a mask.

On the other hand, the memory cell array neighboring region 105 is covered by the resist pattern 10. Therefore, the diffusion layer is not formed in the semiconductor substrate 1 on the memory cell array neighboring region 105 side.

Figure 18:
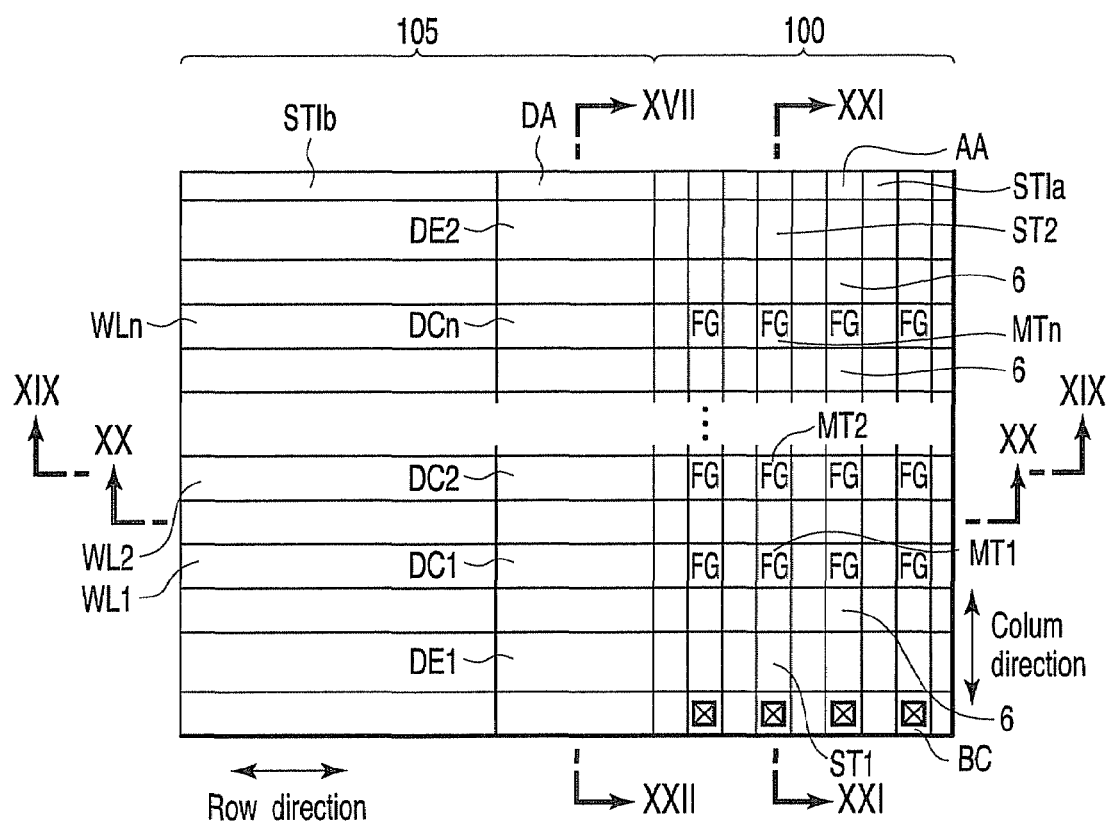
FIG. 18 is a plan view showing a step of the manufacturing process of the flash memory according to the embodiment of the present invention.
Figure 21:
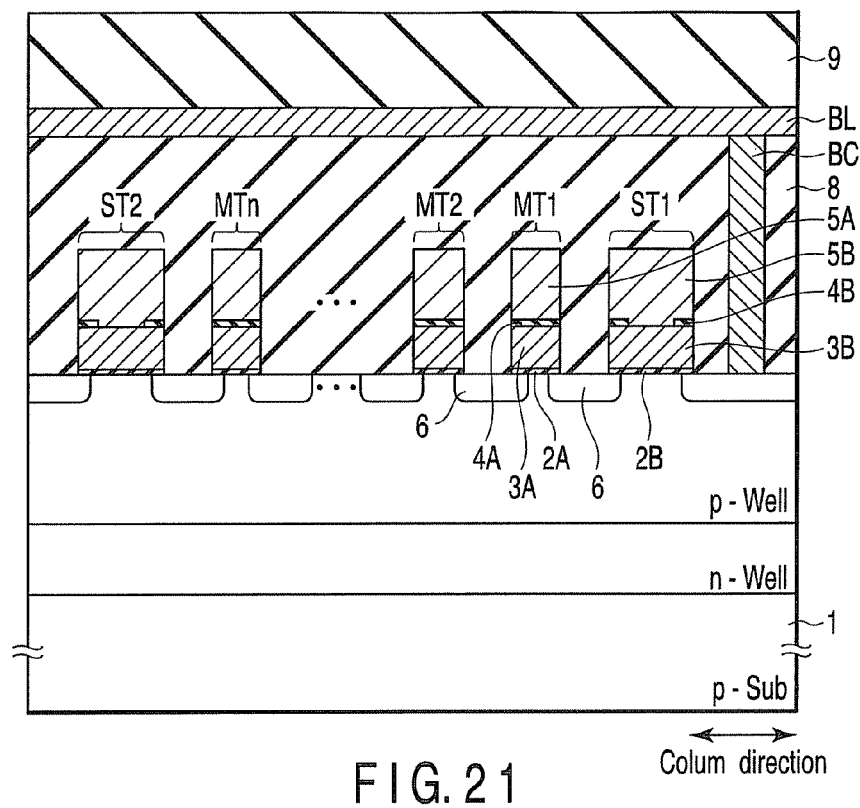
FIG. 21 is a cross-sectional view taken along XXI-XXI line of FIG. 18.
Figure 22:
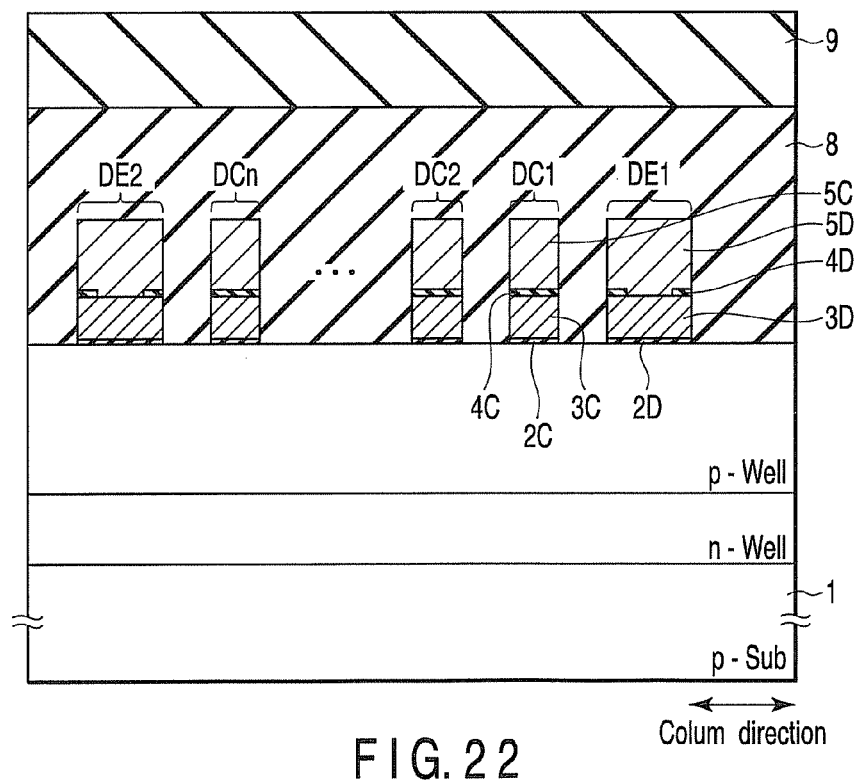
FIG. 22 is a cross-sectional view taken along XXII-XXII line of FIG. 18.

A step of the manufacturing process continued from FIGS. 13 to 17 will next be described with reference to FIGS. 18 to 22. FIG. 18 is a plan view showing a step of the manufacturing process of the flash memory according to the embodiment of the present invention. FIG. 19 is a cross-sectional view taken along XIX-XIX line of FIG. 18. FIG. 20 is a cross-sectional view taken along XX-XX line of FIG. 18. FIG. 21 is a cross-sectional view taken along XXI-XXI line of FIG. 18. FIG. 22 is a cross-sectional view taken along XXII-XXII line of FIG. 18.

After the resist pattern 10 has been removed, an insulating layer 8 is so formed as to cover the entire surface of the semiconductor substrate 1 as shown in FIGS. 18 to 22. Further, in the memory cell array region, a bit lines BL is so formed as to be connected to the select transistor ST1 through a bit line contact BC. Thereafter, a insulating layer 9 is so formed as to cover the entire surfaces of the memory cell array region 100 and memory cell array neighboring region 105.

Through the above processing steps, the flash memory according to the present embodiment is completed.

As described above, the diffusion layer serving as the source/drain regions of the dummy cells DC1 to DCn is not formed in the memory cell array neighboring region which is disposed at the terminal end of the memory cell array region 100 and includes the dummy cells DC1 to DCn each having the same gate structure as that of each of the memory cell transistors MT1 to MTn.

Thus, when a write pulse voltage having a pulse width of 100 μsec or less is applied to the control gate electrodes 5A and 5C (i.e., word lines WL1 to WLn), the depletion layers DL are formed in the semiconductor substrate 1 immediately under the gate electrodes of the dummy cell DC1 to DCn.

Accordingly, the major part of a high write voltage is applied to the depletion layers DL and, therefore, a write voltage to be applied to the inter-gate insulating films 4C of the dummy cells DC1 to DCn is reduced.

Thus, it is possible to reduce a write voltage stress applied to the inter-gate insulating film and, thereby, to reduce dielectric breakdown of the inter-gate insulating film.

3. Others

The embodiment of the present invention can reduce dielectric breakdown of the gate insulating film of the dummy cell and inter-gate insulating film thereof due to a write voltage stress.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
   a memory cell transistor which is disposed in a first region and which has a gate electrode of a stacked structure; and
   a dummy cell which is disposed in a second region neighboring the first region and which has a gate electrode having the same structure as that of the gate electrode of the memory cell transistor, wherein
   the second region is not connected to a contact but electrically in a floating state,
   the memory cell transistor and dummy cell are connected to the same word line, and
   the memory cell transistor has a diffusion layer serving as the source/drain region thereof, while the dummy cell does not have the diffusion layer serving as the source/drain region thereof.

2. The nonvolatile semiconductor memory according to claim 1, wherein
   the size of the second region in the word line extending direction is larger than the size of the first region in the word line extending direction.

3. The nonvolatile semiconductor memory according to claim 2, wherein
   the size of the second region in the word line extending direction is 3 times or more and 20 times or less the size of the first region in the word line extending direction.

4. The nonvolatile semiconductor memory according to claim 1, wherein
   a write voltage to be applied to the memory cell transistor has a pulse voltage width of 100 μsec or less.

5. The nonvolatile semiconductor memory according to claim 1, wherein
   an inter-gate insulating film provided between a control gate electrode and floating gate electrode constituting the stacked gate electrode is a silicon oxide film or silicon oxynitride film.

6. The nonvolatile semiconductor memory according to claim 1, wherein
   an inter-gate insulating film provided between a control gate electrode and floating gate electrode constituting the stacked gate electrode is a stacked film composed of a silicon oxide film and silicon nitride film.

7. A nonvolatile semiconductor memory comprising:
   a memory cell transistor which is disposed in a first region and which has a gate electrode of a stacked structure; and
   a dummy cell which is disposed in a second region neighboring the first region and which has a gate electrode having the same structure as that of the gate electrode of the memory cell transistor, wherein
   the second region is not connected to a contact but electrically in a floating state,
   the size of the second region in the word line extending direction is larger than the size of the first region in the word line extending direction, and
   the memory cell transistor has a diffusion layer serving as the source/drain region thereof, while the dummy cell does not have the diffusion layer serving as the source/drain region thereof.

8. The nonvolatile semiconductor memory according to claim 7, wherein
   the size of the second region in the word line extending direction is 3 times or more and 20 times or less the size of the first region in the word line extending direction.

9. The nonvolatile semiconductor memory according to claim 7, wherein
   the memory cell transistor and dummy cell are connected to the same word line.

10. The nonvolatile semiconductor memory according to claim 7, wherein
    a write voltage to be applied to the memory cell transistor has a pulse voltage width of 100 μsec or less.

11. A nonvolatile semiconductor memory comprising:
    a plurality of memory cell transistor which is disposed on an active area extending a first direction in a first region and which has a gate electrode of a stacked structure; and
    a plurality of dummy cell which is disposed on an active area in a second region neighboring the first region and which has a gate electrode having the same structure as that of the gate electrode of the memory cell transistor, wherein
    the second region is not connected to a contact but electrically in a floating state,
    a size of the dummy cell in a second direction perpendicular to the first direction is larger than a size of the memory cell transistor in the second direction, and
    each of the memory cell transistors has a diffusion layer serving as the source/drain region thereof, while each of the dummy cells does not have the diffusion layer serving as the source/drain region thereof.

12. The nonvolatile semiconductor memory according to claim 11, wherein
    the size of the dummy cell in the second direction is 3 times or more and 20 times or less the size of the memory cell transistor in the second direction.

13. The nonvolatile semiconductor memory according to claim 12, wherein
    the size of the dummy cell in the second direction is represented by $(2n+1)F$,
    where n is a natural number, and F is the size of the memory cell transistor as viewed in the second direction.

14. The nonvolatile semiconductor memory according to claim 11, wherein
    each of the memory cell transistors is disposed in series along the first direction and is connected to the dummy cell linearly arranged in the second direction by a word line.

15. The nonvolatile semiconductor memory according to claim 14, wherein
    a write voltage to be applied to the memory cell transistor has a pulse voltage width of 100 μsec or less.

16. The nonvolatile semiconductor memory according to claim 14, wherein
    the active area in the first region is divided in the second direction by an isolation insulating film.

17. The nonvolatile semiconductor memory according to claim 16, wherein
 select transistors are disposed both sides of the first direction of the memory cell transistor and each of the select transistors is connected to dummy cells linearly arranged in the second direction by a select gate line.

18. The nonvolatile semiconductor memory according to claim 17, wherein
 the memory cell transistor, the select transistor and the dummy cell having,
 an first gate electrode;
 an inter-gate insulating film provided on the first gate electrode;
 a second gate electrode provided on the inter-gate insulating film, respectively, wherein
 each of the second gate electrodes is the ward line or the select gate line.

19. The nonvolatile semiconductor memory according to claim 17, wherein
 the size of the dummy cell in the second direction is 3 times or more and 20 times or less the size of the memory cell in the second direction.

20. The nonvolatile semiconductor memory according to claim 19, wherein
 the size of the dummy cell as measured in the word line extending direction is represented by $(2n+1)F$, and
 the isolation insulating film as measured in the word lone extending direction is F,
 where n is a natural number, and F is the size of the memory cell transistor as viewed in the word line extending direction.

* * * * *